United States Patent
Hoei et al.

(10) Patent No.: US 11,797,383 B2
(45) Date of Patent: Oct. 24, 2023

(54) REDUNDANT ARRAY OF INDEPENDENT NAND FOR A THREE-DIMENSIONAL MEMORY ARRAY

(71) Applicant: Micron Technology, Inc., Boise, ID (US)

(72) Inventors: Jung Sheng Hoei, Newark, CA (US); Sampath K. Ratnam, Boise, ID (US); Renato C. Padilla, Boise, ID (US); Kishore K. Muchherla, Fremont, CA (US); Sivagnanam Parthasarathy, Carlsbad, CA (US); Peter Feeley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 259 days.

(21) Appl. No.: 17/167,254

(22) Filed: Feb. 4, 2021

(65) Prior Publication Data

US 2021/0157673 A1 May 27, 2021

Related U.S. Application Data

(63) Continuation of application No. 16/402,481, filed on May 3, 2019, now Pat. No. 10,936,416, which is a
(Continued)

(51) Int. Cl.
*G06F 11/10* (2006.01)
*G06F 3/06* (2006.01)
(Continued)

(52) U.S. Cl.
CPC .......... *G06F 11/1072* (2013.01); *G06F 3/064* (2013.01); *G06F 3/0608* (2013.01);
(Continued)

(58) Field of Classification Search
None
See application file for complete search history.

(56) References Cited

U.S. PATENT DOCUMENTS

| 5,748,545 | A | 5/1998 | Lee et al. |
| 7,188,270 | B1 | 3/2007 | Sanjeeb et al. |
| (Continued) | | | |

FOREIGN PATENT DOCUMENTS

| CN | 102163465 | 8/2011 |
| CN | 103034458 A | 4/2013 |
| CN | 103902403 | 7/2014 |

OTHER PUBLICATIONS

International Search Report and Written Opinion from related international patent application No. PCT/US2017/018252, dated Jun. 1, 2017, 10 pp.

(Continued)

*Primary Examiner* — Cynthia Britt
*Assistant Examiner* — Matthew W Wahlin
(74) *Attorney, Agent, or Firm* — Brooks, Cameron & Huebsch, PLLC

(57) ABSTRACT

The present disclosure includes a redundant array of independent NAND for a three dimensional memory array. A number of embodiments include a three-dimensional array of memory cells, wherein the array includes a plurality of pages of memory cells, a number of the plurality of pages include a parity portion of a redundant array of independent NAND (RAIN) stripe, and the parity portion of the RAIN stripe in each respective page comprises only a portion of that respective page.

17 Claims, 6 Drawing Sheets

Related U.S. Application Data continuation of application No. 15/053,719, filed on Feb. 25, 2016, now Pat. No. 10,318,378.

(51) Int. Cl.

| | | |
|---|---|---|
| *G11C 11/56* | (2006.01) | |
| *G11C 16/04* | (2006.01) | |
| *G11C 29/00* | (2006.01) | |
| *H10B 43/27* | (2023.01) | |
| *G11C 29/52* | (2006.01) | |

(52) U.S. Cl.
CPC .......... *G06F 3/0619* (2013.01); *G06F 3/0625* (2013.01); *G06F 3/0688* (2013.01); *G06F 11/10* (2013.01); *G06F 11/1076* (2013.01); *G11C 11/5642* (2013.01); *G11C 29/52* (2013.01); *G11C 29/74* (2013.01); *H10B 43/27* (2023.02); *G11C 16/0483* (2013.01); *Y02D 10/00* (2018.01)

(56) References Cited

U.S. PATENT DOCUMENTS

| | | |
|---|---|---|
| 7,962,836 B1 | 6/2011 | Lee et al. |
| 8,225,006 B1 | 7/2012 | Karamcheti |
| 8,427,872 B2 | 4/2013 | Kim |
| 8,503,213 B2 | 8/2013 | Chen et al. |
| 8,609,536 B1 | 12/2013 | Ha et al. |
| 8,707,122 B1 | 4/2014 | Micheloni et al. |
| 8,775,868 B2 | 7/2014 | Colgrove et al. |
| 8,788,910 B1 | 7/2014 | Northcott |
| 8,898,548 B1 | 11/2014 | Mullendore et al. |
| 9,026,887 B2 | 5/2015 | Manning et al. |
| 9,088,303 B2 | 7/2015 | Larsen et al. |
| 9,110,835 B1 | 8/2015 | Call et al. |
| 9,111,591 B2 | 8/2015 | Tanzawa |
| 9,111,592 B2 | 8/2015 | Maejima |
| 9,170,757 B1 | 10/2015 | Shihadeh et al. |
| 9,208,018 B1 | 12/2015 | Northcott et al. |
| 9,355,735 B1 | 5/2016 | Chen et al. |
| 9,569,320 B2 | 2/2017 | Werner et al. |
| 2001/0018729 A1* | 8/2001 | Johnson .............. G06F 11/1076 714/E11.034 |
| 2006/0200697 A1 | 9/2006 | Ito |
| 2007/0117317 A1* | 5/2007 | Ikeda ..................... G11C 5/025 438/257 |
| 2008/0115017 A1 | 5/2008 | Jacobson |
| 2009/0013223 A1 | 1/2009 | Lam |
| 2011/0149659 A1 | 6/2011 | Goda et al. |
| 2011/0242872 A1 | 10/2011 | Hanzawa |
| 2012/0166913 A1 | 6/2012 | Alrod et al. |
| 2012/0204077 A1 | 8/2012 | D'Abreu et al. |
| 2012/0324150 A1 | 12/2012 | Moshayedi et al. |
| 2014/0025887 A1 | 1/2014 | Kim et al. |
| 2014/0122773 A1 | 5/2014 | Abraham et al. |
| 2014/0241026 A1 | 8/2014 | Tanzawa |
| 2014/0245097 A1 | 8/2014 | Larsen et al. |
| 2014/0281691 A1 | 9/2014 | Danilak et al. |
| 2015/0089325 A1* | 3/2015 | Chandrasekhar ...... G11C 16/22 714/766 |
| 2015/0199151 A1 | 7/2015 | Klemm et al. |
| 2017/0116076 A1 | 4/2017 | Sharma et al. |

OTHER PUBLICATIONS

Office Action from related Taiwanese patent application No. 106106545, dated Oct. 5, 2017, 28 pp.
Office Action from related Taiwanese patent application No. 106106545, dated Feb. 26, 2018, 31 pp.
Extended European Search Report from related European patent application No. 17757023.1, dated Sep. 26, 2019, 8 pages.
Second Notice of Preliminary Rejection from related Korean patent application No. 10-2018-7025746, dated Aug. 10, 2020, 10 pages.
Yi, et al., "Dual RAID: A Scheme for High Reliable All Flash Array", IEEE, Conference Paper, 2014, pp. 218-222.
Motwani, et al., "Soft Decision Decoding of RAID Stripe for Higher Endurance of Flash Memory Based Solid State Drives", IEEE, Conference Paper, 2015, Pertinent to pp. 603-607.
First Office Action from related Chinese patent application No. 201780012982.8, dated Jul. 29, 2021, 32 pages.

* cited by examiner

REDUNDANT ARRAY OF INDEPENDENT NAND FOR A THREE-DIMENSIONAL MEMORY ARRAY

PRIORITY INFORMATION

This application is a Continuation of U.S. application Ser. No. 16/402,481, filed on May 3, 2019, which is a Continuation of U.S. application Ser. No. 15/053,719, filed Feb. 25, 2016, which has now issued as U.S. Pat. No. 10,318,378 on Jun. 11, 2019, the contents of which are included herein by reference.

TECHNICAL FIELD

The present disclosure relates generally to semiconductor memory and methods, and more particularly, to a redundant array of independent NAND for a three-dimensional memory array.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

Flash memory devices, such as those used to create flash SSDs, can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell, and the state of the cell can be determined by sensing the stored charge (e.g., the Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

During operation of a flash memory device, a number of defects and/or errors, such as, for instance, electrical shorts between different components of the memory, may occur. Such defects and/or errors can cause data stored in the memory to be lost, which can result in a failure of the memory. One approach to protect against such a memory failure (e.g., to protect the data stored in the memory) is to use a redundant array of independent NAND (RAIN) data protection scheme, which can divide and/or replicate the data stored in the memory among multiple memory devices.

BRIEF DESCRIPTION OF THE DRAWINGS

FIG. 4 is a chart illustrating an example of data storage in a three-dimensional memory array in accordance with a number of embodiments of the present disclosure.

DETAILED DESCRIPTION

Figure 1:
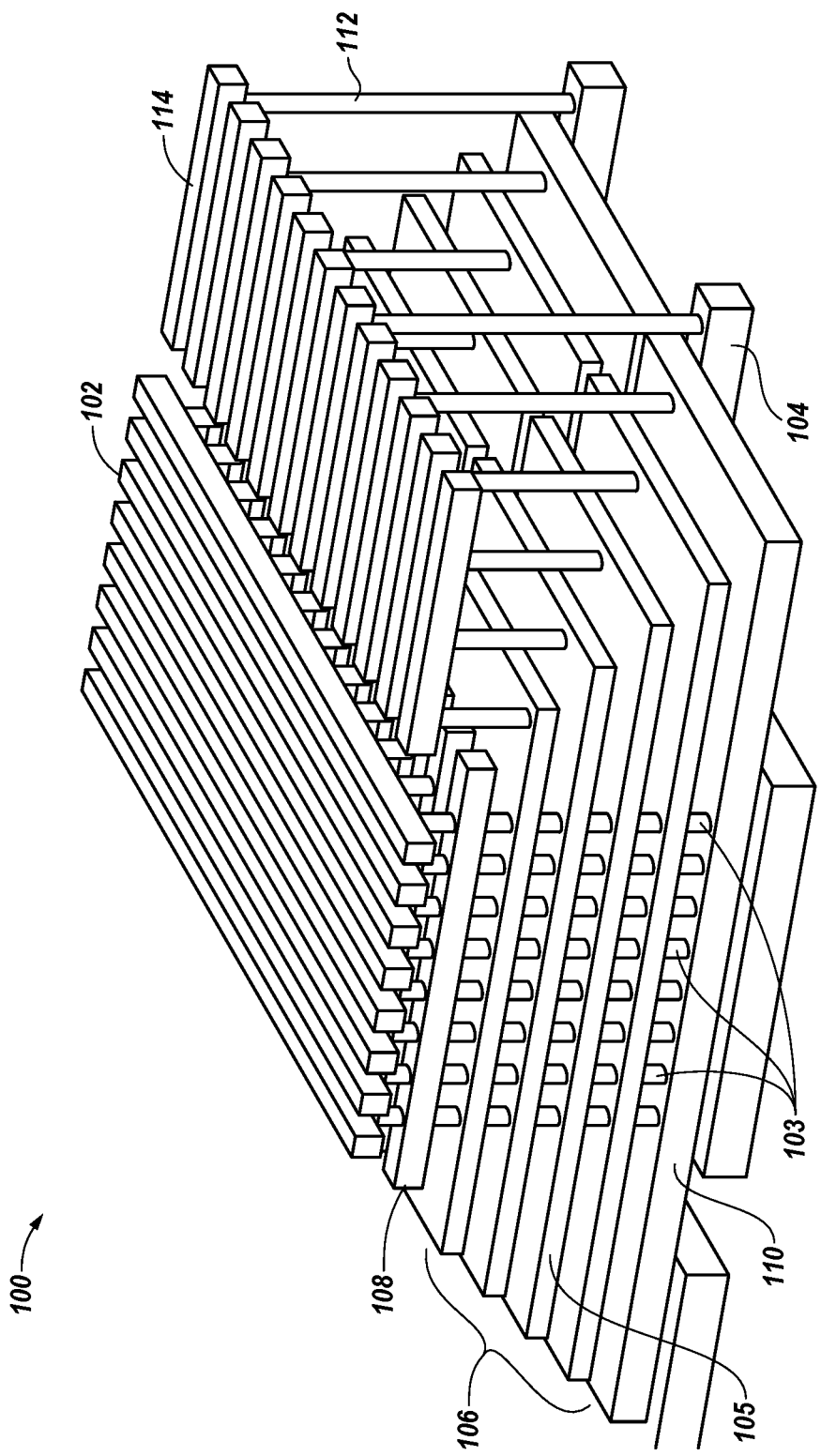
FIG. 1 illustrates a perspective view of a portion of a three-dimensional memory array in accordance with a number of embodiments of the present disclosure.

The present disclosure includes a redundant array of independent NAND for a three-dimensional memory array. A number of embodiments include a three-dimensional array of memory cells, wherein the array includes a plurality of pages of memory cells, a number of the plurality of pages include a parity portion of a redundant array of independent NAND (RAIN) stripe, and the parity portion of the RAIN stripe in each respective page comprises only a portion of that respective page.

The amount of protection provided by a RAIN protection scheme may depend on the overhead density (e.g., the footprint) of the RAIN in the memory. For example, the amount of data in a memory that can be protected by a RAIN protection scheme may depend on the size of (e.g., number of memory cells in) the portion of the memory dedicated to the RAIN. For instance, the greater the size of the RAIN-dedicated portion of the memory, the greater the amount of protection that may be provided by the RAIN against failure of the memory. However, as the size of the RAIN-dedicated portion of the memory increases, the amount of the memory available to store other data, such as user data, decreases.

RAIN protection approaches in accordance with the present disclosure, however, can have a lower overhead density than previous RAIN protection approaches, while providing the same (or similar) amount of protection as previous RAIN protection approaches. For example, the size of the RAIN-dedicated portion in a three-dimensional memory array in accordance with the present disclosure can be one-fourth the size of a RAIN dedicated portion in previous RAIN protection approaches, while providing the same (or similar) amount of protection, thereby allowing the memory to store a greater amount of user data than previous approaches.

As used herein, "a number of" something can refer to one or more such things. For example, a number of memory cells can refer to one or more memory cells. Additionally, the designator "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 200 in FIG. 2.

FIG. 1 illustrates a perspective view of a portion of a three-dimensional memory array 100 in accordance with a number of embodiments of the present disclosure. The memory array 100 can comprise, for example, a NAND flash memory array. Memory array 100 includes a number of vertical strings of series-coupled memory cells 103 oriented orthogonal to a number of conductive lines, such as access lines 105 and/or data lines 102. In the example illustrated in FIG. 1, memory cells 103 can form a group of memory cells, such as, for instance, a tile group. That is, the portion of memory array 100 illustrated in FIG. 1 can correspond to a group (e.g., tile group) of memory cells.

As used herein, A "coupled to" B refers to A and B being operatively coupled together, such as where A and B are electrically connected with each other, such as through a direct ohmic connection or through an indirect connection. Insulating materials between various conductive lines are omitted from FIG. 1 for clarity. Conductive materials can be formed of polysilicon, for example, or other doped or undoped materials. Insulating materials can be formed of oxide, for example, or other dielectric materials.

A plurality of data lines 102 can be oriented in a first plane, and further oriented in a first direction in the first plane, the vertical strings of series-coupled memory cells 103 being oriented orthogonal to the first plane. A plurality of access lines 105 can be oriented in a second plane, and further oriented in a second direction in the second plane. As shown in FIG. 1, the access lines 105 can be formed in a planar configuration. The second plane can be substantially parallel to the first plane. The second direction can be perpendicular to the first direction, for example. The data lines 102 can be shared by a number of vertical strings of series-coupled memory cells 103 in the first direction, and the access lines 105 can be shared by a number of vertical strings of series-coupled memory cells 103 in the second direction.

One or more source lines 104 can be oriented in a third plane, the third plane being substantially parallel to the first and second planes. The source lines 104 can be further oriented in the second direction, for instance, the same direction as the access lines 105 as shown in FIG. 1, or in a different direction. The select gates 108 and 110 can operate to select a particular vertical string of series-coupled memory cells 103 between a data line 102 and a source line 104. As such, the vertical strings of series-coupled memory devices 103 can be located at the intersections of the data lines 102 and source line 104.

The access lines 105 are coupled to (and in some cases form) control gates of memory cells at a particular level and can be used to select a particular one of the series-coupled memory cells within a vertical string. In this manner, a particular memory cell can be selected and electrically coupled to a data line 102 via operation of the first select gate 108, second select gate 110, and an access line 105. The access lines 105 can be configured to select a memory cell at a particular location within one or more of the vertical strings of series-coupled memory cells 103.

As illustrated in FIG. 1, the planar access lines 105 can be configured to have multiple three-dimensional stair step structures 106 to facilitate vertically-oriented coupling thereto, such as by vertical conductors 112. As such, respective planar access lines 105 can be formed as respective stair steps of the stair step structure 106. A stair step structure 106, as used herein, means a three-dimensional structure having a plurality of stair steps at different elevations extending to different distances in a lateral direction, such as is generally associated with a set of stair steps. According to one embodiment of the present disclosure, the steps of lower elevations can extend laterally beyond the lateral distance that the step at an immediately higher elevation extends, as shown in FIG. 1. For instance, lower steps extend further in a lateral direction than step(s) above. A lower step can extend laterally a sufficient distance beyond a next higher step so that a vertical coupling can be made to the portion of the lower step extending laterally past the next higher step. In this manner, a vertical conductor 112 can be coupled to the lower step, such as to an access line 105, select gate 108 or 110, or source line 104, which each can correspond to a step in the stair step structure 106.

The memory array 100 can be coupled to various circuitry associated with operating the memory array 100. Such circuitry can include string driver circuitry, for instance, as will be described further in connection with FIG. 2. As an example, horizontal conductive lines 114 can be routed from the memory array 100, for example, to a string driver. Steps of the stair step structure 106 can be coupled to the conductive lines 114, for instance, via the vertical conductors 112. In this manner, an electrical coupling can be made between the vertical stack of access lines 105, select gates 108/110, and/or source lines 104, and the string driver, via the planar horizontal conductive lines 114.

The strings of NAND memory cells can be arranged with select gate transistors coupled at each end (e.g., source, drain). Each string can include a number of memory cells coupled in series, drain-to-source. Vertical strings of NAND memory cells can be arranged such that the string of series-coupled memory cells are linearly arranged in a vertical orientation, or can be arranged in non-linear configuration such as in a "U" shape, with portions of the "U" shape being oriented vertically, for example. For instance, the string of series-coupled memory cells can be arranged in a dimension orthogonal to the planes encompassing the access lines (e.g., word lines) and data lines (e.g., bit lines).

Figure 2:
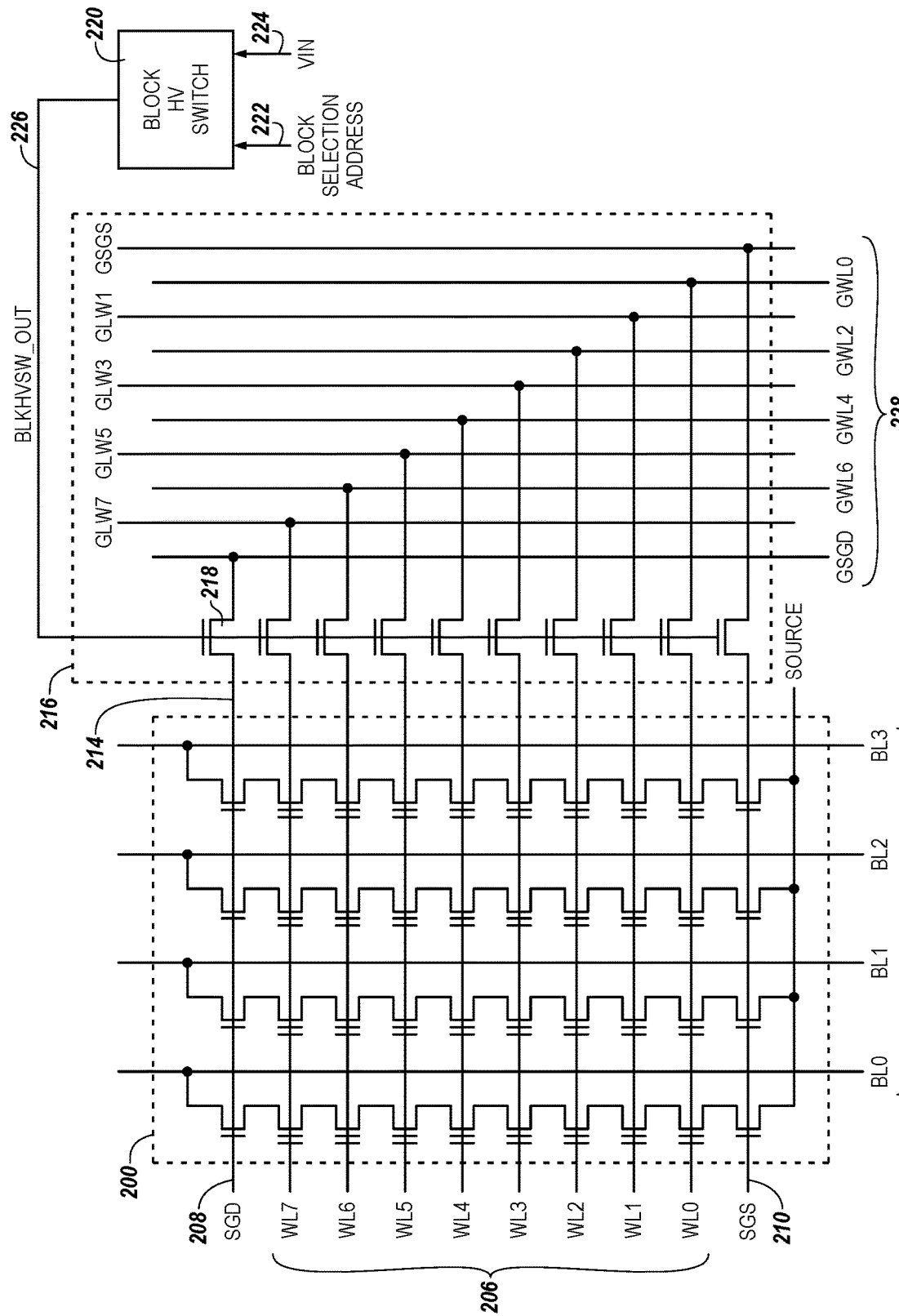
FIG. 2 is a schematic diagram illustrating connection between a portion of a three-dimensional memory array and a string driver in accordance with a number of embodiments of the present disclosure.

FIG. 2 is a schematic diagram illustrating connection between a portion of a three-dimensional memory array 200 and a string driver 216 in accordance with a number of embodiments of the present disclosure. Memory array 200 can be, for example, memory array 100 previously described in connection with FIG. 1.

String driver 216 can be used to control selection of particular strings of memory cells and/or particular memory cells, such as by application of a voltage signal of particular select gates and/or particular memory cells within the strings of memory cells by, for instance, appropriate assertion of access lines 206. FIG. 2 illustrates the access lines 206, select gate 208 (SGD), and select gate 210 (SGS) of memory array 200 being coupled to a string driver 216 via a number of conductive lines 214. Conductive lines 214, and/or the area between memory array 200 and string driver 216 in which conductive lines 214 couple memory array 200 to string driver 216, can be referred to as an interface between memory array 200 and string driver 216. The string driver 216 can be formed using CMOS devices, for example. The memory array 200 further includes the data lines 202 arranged as shown and coupled to the strings of memory cells.

The access lines 206, select gate 208 (SGD), and select gate 210 (SGS) of a memory array 200 can be coupled to respective global access lines 228 through selection transistors 218. The selection transistors 218 can be field effect transistors (FETs), for example. The selection transistors 218 can be controlled via the block high voltage switch output (BLKHVSW_OUT) signal line 226, which is coupled between an output of a block high voltage switch 220 and, for example, the gate of each of the selection transistors 218. The block high voltage switch 220 receives as inputs, for example, a block selection address 222 and an input voltage 224 to produce the BLKHVSW_OUT signal on the block high voltage switch output signal line 226 when appropriate to couple the access lines 206, select gate 208 (SGD), and select gate 210 (SGS) of memory array 200 to the global access lines 228.

In a sense operation, such as a read or a program verify operation, global access line driver 216 can provide positive voltage signals to global access lines 228 (e.g., global word lines) to select a particular local access line coupled to memory cells being sensed. Unselected access lines, such as access lines not coupled to memory cells being read or verified, can be provided with a pass voltage (Vpass), while the selected access line can be provided with a read voltage. Other techniques are possible for reading and/or programming memory cells, as will be appreciated by one of skill in the art. According to various embodiments, the memory array 200 can be implemented as a three-dimensional memory array with the strings being oriented vertically, and the string driver 216, including the selection transistors 218, can be implemented as a substantially planar device. A stair step structure comprising the conductive lines 214 can be used to electrically couple the vertical three-dimensional array and horizontal planar structures (e.g., string driver 216).

Figure 3:
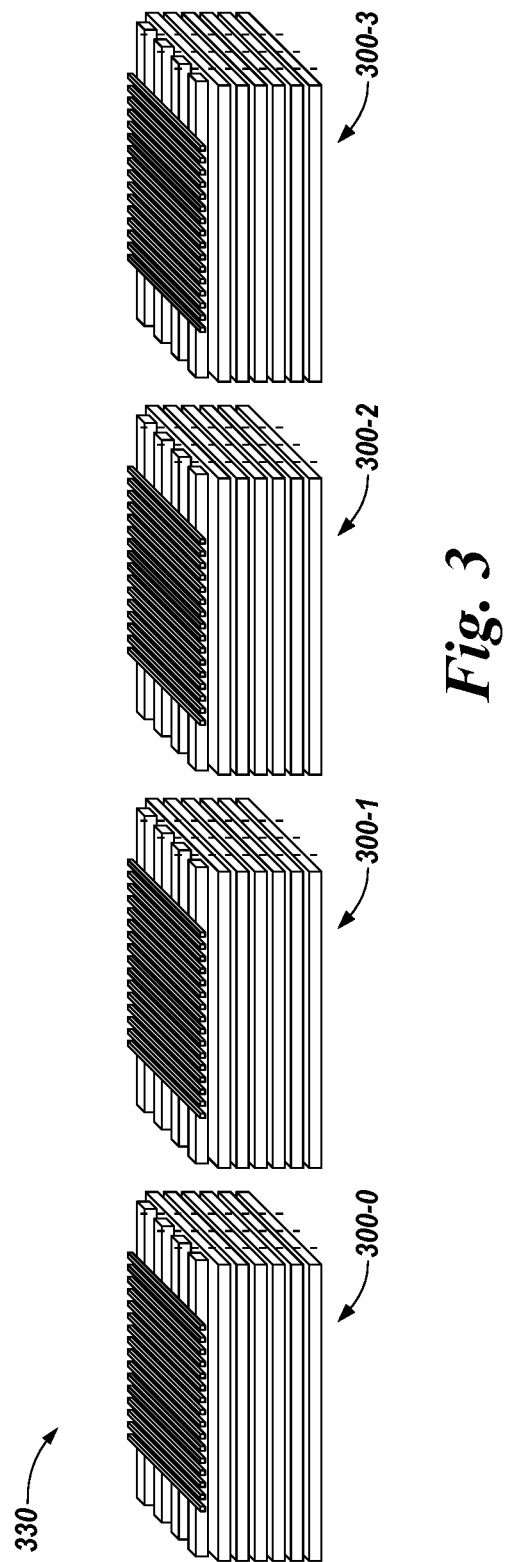
FIG. 3 illustrates an example of a three-dimensional memory array in accordance with a number of embodiments of the present disclosure.

FIG. 3 illustrates an example of a three-dimensional memory array 330 in accordance with a number of embodiments of the present disclosure. As shown in FIG. 3, memory array 330 can include a plurality of portions 300-0, 300-1, 300-2, and 300-3. Each respective portion 300-0, 300-1, 300-2, and 300-3 of memory array 330 can be analogous to the portion of memory array 100 previously described in connection with FIG. 1. For example, memory array 330 can be a three-dimensional NAND flash memory array comprising portions 300-0, 300-1, 300-2, and 300-3 having a stair step structure, as previously described in connection with FIG. 1. Further, each respective portion 300-0, 300-1, 300-2, 300-3 can correspond to a group (e.g., a tile group) of memory cells, as previously described in connection with FIG. 1. Although the embodiment illustrated in FIG. 3 includes four portions (e.g., four groups of memory cells), embodiments of the present disclosure are not so limited.

Although not shown in FIG. 3 for clarity and so as not to obscure embodiments of the present disclosure, each respective portion (e.g., group) 300-0, 300-1, 300-2, and 300-3 of memory array 330 can have a string driver analogous to string driver 216 previously described in connection with FIG. 2 associated therewith. For example, each respective group 300-0, 300-1, 300-2, and 300-3 can have a different string driver coupled to and configured to operate that respective group, in a manner analogous to that described in connection with FIG. 2. Further, the string drivers can operate their respective groups in parallel. For example, the string drivers can perform program and/or sense operations on their respective groups in parallel.

Memory array 330 can include a number of physical blocks of memory cells, such as, for instance, 128 blocks, 512 blocks, or 1,024 blocks. However, embodiments are not limited to a particular multiple of 128 or any particular number of physical blocks. A number of physical blocks of memory cells can be included in a plane of memory cells, and a number of planes of memory cells can be included on a die. Each physical block of memory cells can include a number of physical rows of memory cells coupled to access lines (e.g., word lines), and each row can include a number of pages of memory cells (e.g., physical pages). A physical page refers to a unit of programming and/or sensing (e.g., a number of memory cells that are programmed and/or sensed together as a functional group). For example, each row can comprise one physical page of memory cells, or each row can comprise multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data).

In a number of embodiments, each respective group 300-0, 300-1, 300-2, and 300-3 of memory array 330 can include a different portion of each respective page of memory cells. For instance, group 300-0 can include a first portion of each respective page, group 300-1 can include a second portion of each respective page, etc. As such, memory array 330 can include a plurality of groups of memory cells (e.g., tile groups 300-0, 300-1, 300-2, and 300-3) and a plurality of pages of memory cells, wherein each respective group includes a different portion of each respective page.

A number of the pages of memory cells in memory array 330 can include (e.g., store) a parity portion of a redundant array of independent NAND (RAIN) stripe. For instance, each respective one of the number of pages can include a parity portion of a different RAIN stripe. RAIN, as used herein, is an umbrella term for computer information (e.g., data) storage schemes that divide and/or replicate (e.g., mirror) information among multiple pages of multiple memory devices, for instance, in order to help protect the data stored in the memory devices. The multiple memory devices in a RAIN array may appear to a user and the operating system of a computer as a single memory device (e.g., disk). RAIN can include striping (e.g., splitting) information so that different portions of the information are stored on different pages of different memory devices. The portions of the more than one device that store the split data are collectively referred to as a stripe. In contrast, RAIN can also include mirroring, which can include storing duplicate copies of data on more than one page of more than one device. As an example of the former, write data can be striped across N−1 of N memory devices, where error information can be stored in an Nth memory device.

A RAIN stripe can include (e.g., be a combination of) user data and parity data. The parity data of the RAIN stripe, which can be referred to herein as the parity portion of the RAIN stripe, can include error protection data that can be used to protect user data stored in the memory against defects and/or errors that may occur during operation of the memory. For example, the RAIN stripe (e.g., the parity portion of the RAIN stripe) stored in memory array 330 can protect user data stored in memory array 330 against defects and/or errors that may occur during operation of the memory, and can therefore provide protection against a failure of the memory. Defects and/or errors the RAIN stripe can provide protection against include electrical shorts that may occur between different components of the memory, such as, for example, access line to access line shorts that may occur in groups 300-0, 300-1, 300-2, and/or 300-3 and/or shorts that may occur at the interface between groups 300-0, 300-1, 300-2, and/or 300-3 and the respective string driver associated therewith, as will be further described herein.

In a number of embodiments, the parity portion of the RAIN stripe stored in each respective page can comprise only a portion of that page. That is, the parity portion of the RAIN stripe stored in each respective page may comprise less than all of that page. For instance, the parity portion of the RAIN stripe stored in each respective page may comprise one-fourth of that respective page. As such, the size of the parity portion of each respective RAIN stripe can be less than the size of the page in which the parity portion of that RAIN stripe is stored. For instance, only one-fourth of the cells of the page may be used to store the parity portion of the RAIN stripe. However, embodiments of the present disclosure are not limited to this example. For instance, the parity portion of the RAIN stripe stored in each respective page may comprise more or less than one-fourth of that respective page. Further, the size of the parity portion of each respective RAIN stripe can correspond to (e.g., be the same size as) the size of each different portion of each respective page included in each respective group of memory cells. The parity portion of each respective RAIN stripe can be stored in the same group of memory cells, or different parity portions of different RAIN stripes can be stored in different groups.

The remaining portion of each respective page of memory cells that includes a parity portion of the RAIN stripe, as well as the pages that do not include any portion of the RAIN stripe, can include (e.g., store) user data. For example, if the parity portion of the RAIN stripe stored in a page comprises one-fourth of that page, then three-fourths of that page can be used to store user data. In such an example, the portion of each respective page that includes the parity portion of the RAIN stripe can be a portion of one of the groups of memory cells (e.g., group 300-1, 300-2, 300-3, or 300-4), and the remaining portion of that respective page that includes user data can be portions of the other groups of memory cells. An example further illustrating the storage the RAIN stripe and user data in memory array 330 will be further described herein (e.g., in connection with FIG. 4).

In contrast, in previous RAIN protection approaches, the parity portion of the RAIN stripe that would be stored in each respective page of memory cells would comprise the entire page. That is, in previous RAIN protection approaches, the parity portion of the RAIN stripe that would be stored in each respective page would comprise all of that page. As such, in previous approaches, each respective page of memory cells that includes a parity portion of the RAIN stripe would not also be able to include, or be used to store, user data, thereby reducing the amount of memory that would be available to store user data as compared to embodiments of the present disclosure. For instance, the size of the parity portion of the RAIN stripe in previous RAIN protection approaches may be four times the size of the parity portion of the RAIN stripe in embodiments of the present disclosure. In such an example, four times as many memory cells may be needed to store the parity portion of the RAIN stripe than in embodiments of the present disclosure.

However, even though the RAIN stripe (e.g., the parity portion of the RAIN stripe) of the present disclosure uses less overhead than the RAIN stripe in previous approaches, the RAIN stripe of the present disclosure may still provide the same (or similar) amount of protection as the RAIN stripe in previous approaches. For example, the RAIN stripe of the present disclosure can provide protection for each group 300-0, 300-1, 300-2, and 300-3 of memory array 330. For instance, the RAIN stripe of the present disclosure can provide protection for all user data stored in each group 300-0, 300-1, 300-2, and 300-3 of memory array 330.

The RAIN stripe of the present disclosure can provide the same (or similar) amount of protection as the RAIN stripe in previous approaches because, for example, of the tile group structure of memory array 330. For instance, because memory array 330 includes (e.g., is broken into) groups 300-0, 300-1, 300-2, and 300-3, with each respective group having a three-dimensional stair step structure and its own respective string driver coupled thereto, any defects and/or errors that may result in a failure of memory array 330, such as, for instance, access line to access line shorts and/or string driver interface shorts, are likely to occur in only one of the groups. Because the probability of such defects and/or errors occurring in more than one of the groups is so much less than the probability of such defects and/or errors occurring in only one of the groups, the RAIN stripe of the present disclosure may only have to provide protection against a failure that may occur in only one group to be able to effectively provide protection for all groups.

Figure 4:
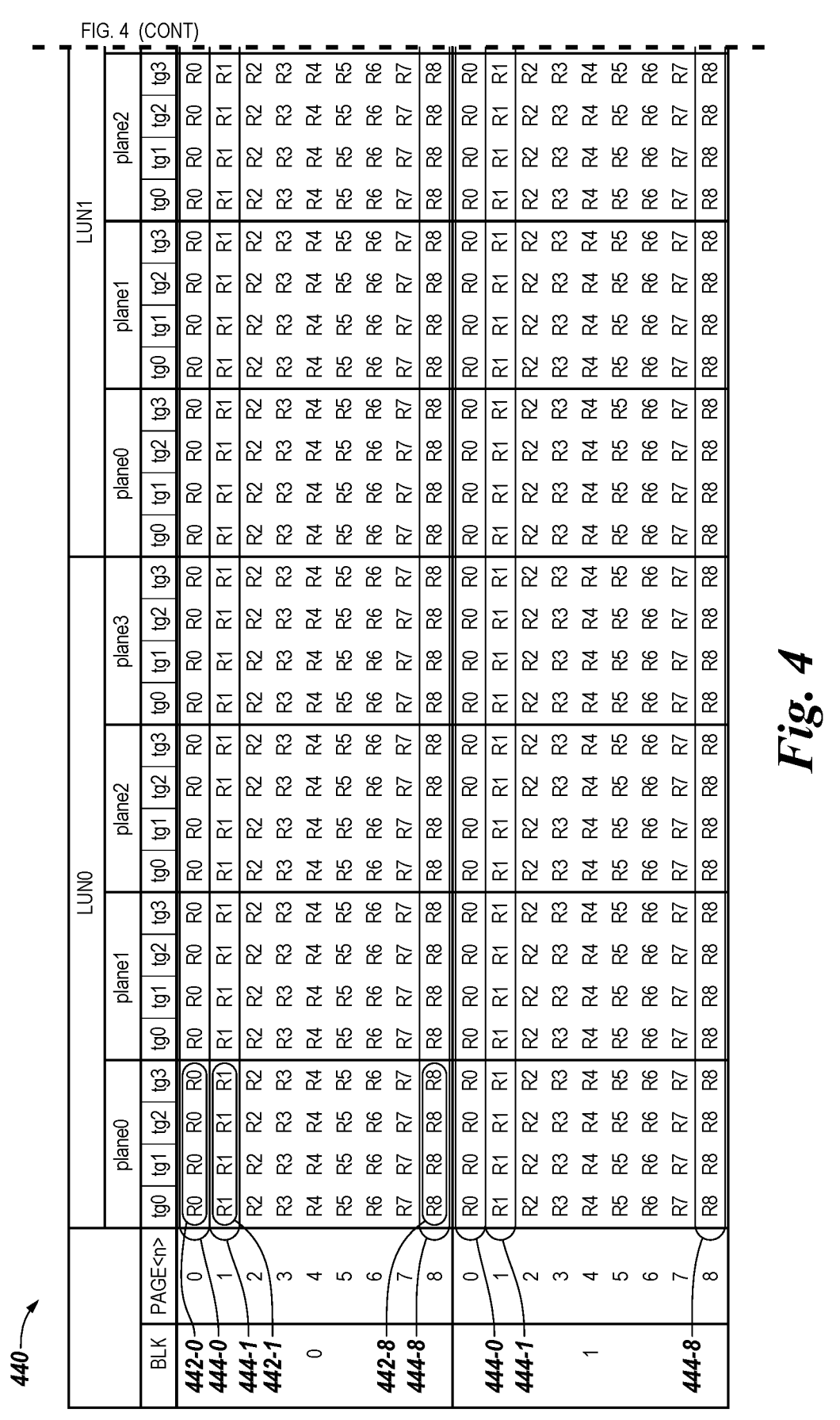
Figure 4:
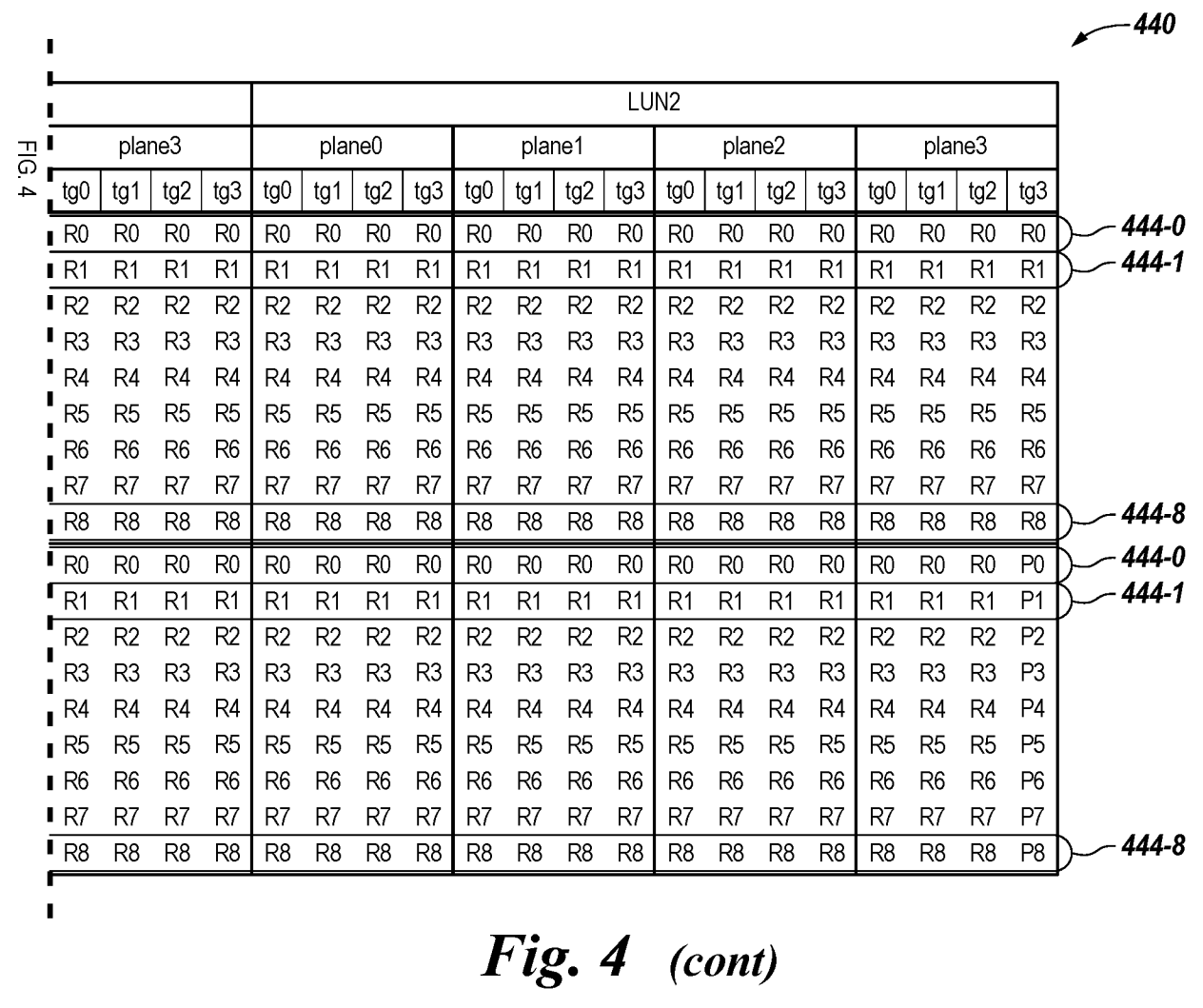

FIG. 4 is a chart 440 illustrating an example of data storage in a three-dimensional memory array in accordance with a number of embodiments of the present disclosure. The three dimensional memory array can be, for example, memory array 330 having tile groups 300-0, 300-1, 300-2, and 300-3, and the data stored therein can include RAIN stripes having user data and parity data (e.g., a parity portion), as previously described herein (e.g., in connection with FIG. 3). In the example illustrated in FIG. 4, tile groups 300-0, 300-1, 300-2, and 300-3 are represented as tg0, tg1, tg2, and tg3, respectively.

In the example illustrated in FIG. 4, the memory array includes three logical units (represented as LUN0, LUN1, and LUN2), and each respective logical unit includes four planes of memory cells (plane0, plane1, plane2, and plane3). Further, the memory array includes two blocks of memory cells (represented as Blk0 and Blk1), and each respective block includes nine pages of memory cells (represented as page, page 1, . . . , page 8). As an example, page 442-0 illustrated in FIG. 4 is page 0 of block 0 of plane 0 of LUN 0, and the memory cells of page 442-0 store user data, as represented by the four R0s, with each different R0 representing a different portion of the user data of a first RAIN stripe (e.g., RAIN stripe 444-0). Further, page 442-1 is page 1 of block 0 of plane 0 of LUN 0, and the memory cells of page 442-1 store user data, as represented by the four R1s, with each different R1 representing a different portion of the user data of a second RAIN stripe (e.g., RAIN stripe 444-1), and so on, up to page 442-8, which is page 8 of block 0 of plane 0 of LUN 0, and whose memory cells store user data, as represented by the four R8s, with each different R8 representing a different portion of the user data of a ninth RAIN stripe (e.g., RAIN stripe 444-8).

In the example illustrated in FIG. 4, each respective page of memory cells can store 16 kB of data. For instance, each respective R0 of page 442-0 represents 4 different kB of user data, such that 16 kB of user data is stored in page 442-0. However, embodiments of the present disclosure are not limited to these data amounts.

Further, each respective group of the memory array can include a different portion of each respective page of memory cells. For instance, in the example illustrated in FIG. 4, each page of memory cells includes four different portions, with each different portion a part of a different one of the four groups. As an example, group tg0 includes a first portion of page 442-0, group tg1 includes a second portion of page 442-0, group tg2 includes a third portion of page 442-0, and group tg3 includes a fourth portion of page 442-0, with each portion including 4 kB of data. For instance, user data R0 in the tg0 column of page 442-0 illustrated in FIG. 4 is stored in the memory cells of page 0 of block 0 that are in group tg0, user data R0 in the tg1 column of page 442-0 is stored in the memory cells of page 0 of block 0 that are in group tg1, user data R0 in the tg2 column of page 442-0 is stored in the memory cells of page 0 of block 0 that are in group tg2, and user data R0 in the tg3 column of page 442-0 is stored in the memory cells of page 0 of block 0 that are in group tg3.

As shown in FIG. 4, a RAIN stripe can be stored across different pages of memory cells in the memory array, with a different portion of the RAIN stripe stored in each respective page. For instance, the example illustrated in FIG. 4 includes nine RAIN stripes, with each RAIN stripe stored across different pages of memory cells. As an example, RAIN stripe 444-0 includes each different portion R0 of user data stored in each respective page 0 of each respective block of each respective plane of each respective LUN, as well as parity portion P0 stored in page 0 of block 1 of plane 3 of LUN 2. Further, RAIN stripe 444-1 includes each different portion R1 of user data stored in each respective page 1 of each respective block of each respective plane of each respective LUN, as well as parity portion P1 stored in page 1 of block 1 of plane 3 of LUN 2, and so on, up to RAIN stripe 444-8, which includes each different portion R8 of user data stored in each respective page 8 of each respective block of each respective plane of each respective LUN, and parity portion P8 stored in page 8 of block 1 of plane 3 of LUN 2. As such, the user data of a RAIN stripe comprises 95/96 of the stripe, and the parity portion comprises 1/96 of the stripe. The parity portion of each respective RAIN stripe (e.g., parity portions P0 to P8) illustrated in FIG. 4 can protect the user data stored in the rest of the memory array against defects and/or errors that may occur during operation of the memory, as previously described herein.

Further, in the pages in which the parity portion of each respective RAIN stripe is stored, the parity portion comprises only a portion (e.g., less than all) of that page, as illustrated in FIG. 4. For instance, in the example illustrated in FIG. 4, the parity portion of each respective RAIN stripe comprises one-fourth of the page in which it is stored. That is, the parity portion of RAIN stripe 444-0 (e.g., P0) comprises one-fourth of page 0 of block 1 of plane 3 of LUN 2, the parity portion of RAIN stripe 444-1 (e.g., P1) comprises one-fourth of page 1 of block 1 of plane 3 of LUN 2, parity portion P2 comprises one-fourth of page 2 of block 1 of plane 3 of LUN 2, etc. As such, the size of the parity portion of each respective RAIN stripe is less than the size of the page in which it is stored. For instance, one-fourth of the memory cells of page 0 of block 1 of plane 3 of LUN 2 are used to store parity portion P0, one-fourth of the memory cells of page 1 of block 1 of plane 3 of LUN 2 are used to store parity portion P1, one-fourth of the memory cells of page 2 of block 1 of plane 3 of LUN 2 are used to store parity portion P2, etc. Further, in the example illustrated in FIG. 4, each different parity portion P0 to P8 is stored in the same group of memory cells (e.g., group tg3).

As shown in FIG. 4, user data is stored in the remaining portions of each respective page of memory cells in which a parity portion of one of the RAIN stripes is stored, as well as in the pages of the memory array in which no parity portions of the RAIN stripes is stored. For example, three-fourths of the memory cells of page 0 of block 1 of plane 3 of LUN 2 are used to store user data, three-fourths of the memory cells of page 1 of block 1 of plane 3 of LUN 2 are used to store user data, three-fourths of the memory cells of page 2 of block 1 of plane 3 of LUN 2 are used to store user data, etc. Further, the portion of each respective page in which a parity portion of one of the RAIN stripes is stored can be a portion of one of the groups of memory cells, and the remaining portions of that respective page that include user data can be portions of the other groups of memory cells. For example, parity portion P0 of RAIN stripe 444-0 is a portion of group tg3, while the remaining portions of page 0 of block 1 of plane 3 of LUN 2 that include user data are portions of groups tg0, tg1, and tg2, as illustrated in FIG. 4.

Figure 5:
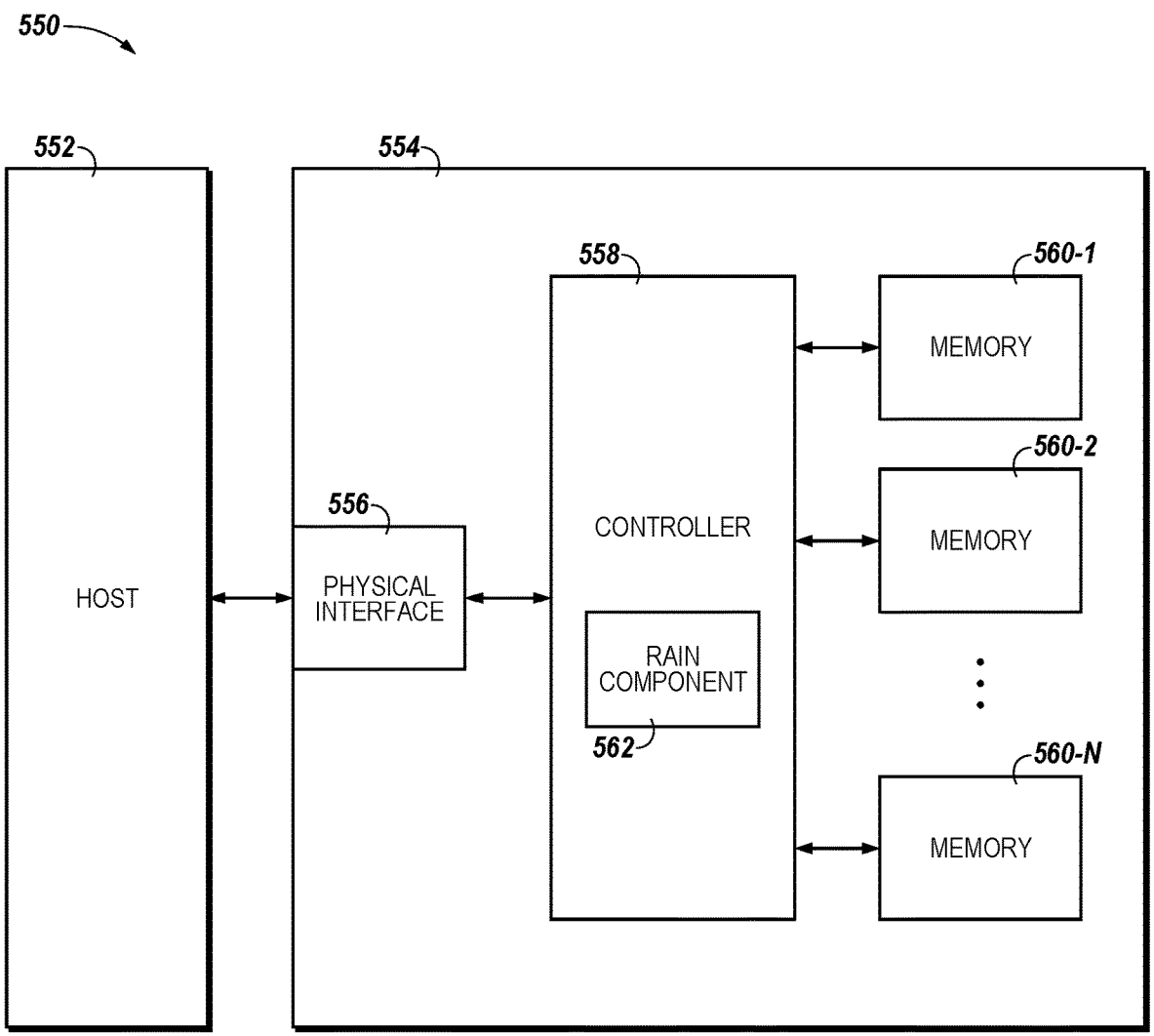
FIG. 5 is a functional block diagram of a computing system including an apparatus in the form of a memory device in accordance with a number of embodiments of the present disclosure.

FIG. 5 is a functional block diagram of a computing system 550 including an apparatus in the form of a memory device 554 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

Memory device 554 can be, for example, a solid state drive (SSD). In the embodiment illustrated in FIG. 5, memory device 204 includes a physical host interface 556, a number of memories 560-1, 560-2, . . . , 560-N, and a controller 558 coupled to physical host interface 556 and memories 560-1, 560-2, . . . , 560-N. Controller 558 can be, for example, an SSD controller, and memories 560-1, 560-2, . . . , 560-N can be, for example, solid state memory devices.

Memories 560-1, 560-2, . . . , 560-N can include, for example, a number of non-volatile memory arrays (e.g., arrays of non-volatile memory cells). For instance, memories 560-1, 560-2, . . . , 560-N can include a number of memory arrays analogous to three-dimensional memory array 330 previously described in connection with FIG. 3.

Physical host interface 556 can be used to communicate information between memory device 554 and another device such as a host 552. Host 552 can include a memory access device, such as a processor. One of ordinary skill in the art will appreciate that "a processor" can intend a number of processors, such as a parallel processing system, a number of coprocessors, etc. Example hosts can include personal laptop computers, desktop computers, digital cameras, digital recording and playback devices, mobile phones such as, for instance, smart phones, PDAs, memory card readers, interface hubs, and the like.

Physical host interface 556 can be in the form of a standardized physical interface. For example, when memory device 554 is used for information storage in computing system 550, physical host interface 556 can be a serial advanced technology attachment (SATA) physical interface, a peripheral component interconnect express (PCIe) physical interface, or a universal serial bus (USB) physical interface, among other physical connectors and/or interfaces. In general, however, physical host interface 556 can provide an interface for passing control, address, information (e.g., data), and other signals between memory device 554 and host 552 having compatible receptors for physical host interface 556.

Controller 558 can include, for example, control circuitry and/or logic (e.g., hardware and firmware). Controller 558 can be included on the same physical device (e.g., the same die) as memories 560-1, 560-2, . . . , 560-N. For example, controller 558 can be an application specific integrated circuit (ASIC) coupled to a printed circuit board including physical host interface 556 and memories 560-1, 560-2, . . . , 560-N. Alternatively, controller 558 can be included on a separate physical device that is communicatively coupled to the physical device that includes memories 560-1, 560-2, . . . , 560-N. In a number of embodiments, components of controller 558 can be spread across multiple physical devices (e.g., some components on the same die as the memory, and some components on a different die, module, or board) as a distributed controller.

Controller 558 can communicate with memories 560-1, 560-2, . . . , 560-N to sense (e.g., read), program (e.g., write), and/or erase information, among other operations. Controller 558 can have circuitry that may be a number of integrated circuits and/or discrete components. For example, controller 558 can include RAIN component 562, as illustrated in FIG. 5. RAIN component 562 can include XOR circuitry, and can be configured to calculate error information (e.g., parity data), including programming and/or sensing data in stripes across memories 560-1, 560-2, . . . , 560-N.

For instance, RAIN component 562 can program data to a RAIN stripe in memories 560-1, 560-2, . . . , 560-N, such as, for instance, the RAIN stripe of memory array 330 and/or RAIN stripes 444-0, 444-1, . . . , 444-8 previously described herein in connection with FIGS. 3 and 4, respectively. Further, RAIN component 562 can sense the data stored in the RAIN stripe(s). The programming and sensing of the RAIN stripe(s) can be performed as tile-based operations, in accordance with the tile group stair step structure of the memories previously described herein.

As an example, RAIN component 562 can detect that a failure has occurred in one of the tile groups of memories 560-1, 560-2, . . . , 560-N. The failure may occur due to, for instance, access line to access line shorts and/or string driver interface shorts, as previously described herein. Upon detecting the failure, RAIN component can sense the data stored in the RAIN stripe(s), and recover the data stored in the memory, including the data stored in the tile group in which the failure occurred, using the sensed data from the RAIN stripe(s).

The embodiment illustrated in FIG. 5 can include additional circuitry, logic, and/or components not illustrated so as not to obscure embodiments of the present disclosure. For example, memory device 554 can include address circuitry to latch address signals provided over I/O connectors through I/O circuitry. Address signals can be received and decoded by a row decoders and column decoders, to access memories 560-1, 560-2, . . . , 560-N.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a three-dimensional array of memory cells having a plurality of groups of memory cells, wherein:
        each of the groups of memory cells has a three-dimensional stair step structure; and
        a number of the groups of memory cells include a parity portion of a redundant array of independent NAND (RAIN) stripe; and
    a plurality of string drivers, wherein each respective string driver is associated with a different one of the groups of memory cells having the three-dimensional stair step structure, and wherein each respective string driver includes a plurality of transistors configured to control selection of the memory cells of the different one of the groups with which that string driver is associated.

2. The apparatus of claim 1, wherein the parity portion of the RAIN stripe is included in a single one of the number of groups of memory cells.

3. The apparatus of claim 1, wherein different portions of the parity portion of the RAIN stripe are included in different ones of the number of groups of memory cells.

4. The apparatus of claim 1, wherein the apparatus includes a controller configured to perform programming of the RAIN stripe as tile-based operations in accordance with the three-dimensional stair step structure of the groups of memory cells.

5. The apparatus of claim 1, wherein:
    the three-dimensional array includes a plurality of pages of memory cells; and each respective group of memory cells includes a different portion of each respective page of memory cells.

6. The apparatus of claim 5, wherein a number of the plurality of pages of memory cells include the parity portion of the RAIN stripe.

7. A method of operating memory, comprising:
storing a parity portion of a redundant array of independent NAND (RAIN) stripe in one or more of a plurality of groups of memory cells in a three-dimensional array of memory cells, wherein each respective group of memory cells has a three-dimensional stair step structure; and
controlling selection of the memory cells of each respective one of the plurality of groups of memory cells in parallel using a plurality of string drivers, wherein each respective string driver is associated with a different one of the plurality of groups of memory cells having the three-dimensional stair step structure.

8. The method of claim 7, wherein the method includes performing sensing of the RAIN stripe as tile-based operations in accordance with the three-dimensional stair step structure of the groups of memory cells.

9. The method of claim 7, wherein the plurality of string drivers control the selection of the memory cells by applying a voltage signal to planar access lines of the three-dimensional array.

10. The method of claim 9, wherein the planar access lines to which the voltage signal is applied are coupled to the memory cells being selected.

11. The method of claim 7, wherein the RAIN stripe provides protection for each of the plurality of groups of memory cells.

12. An apparatus, comprising:
a three-dimensional array of memory cells having a plurality of groups of memory cells, wherein:
each of the groups of memory cells has a three-dimensional stair step structure; and
a number of the groups of memory cells include a parity portion of a redundant array of independent NAND (RAIN) stripe; and
a plurality of string drivers configured to control selection of the memory cells, wherein each respective string driver is associated with a different one of the groups of memory cells having the three-dimensional stair step structure, and wherein each respective string driver is coupled to the different one of the groups of memory cells with which that string driver is associated via planar horizontal conductive lines.

13. The apparatus of claim 12, wherein the apparatus includes a controller configured to perform programming and sensing of the RAIN stripe as tile-based operations in accordance with the three-dimensional stair step structure of the groups of memory cells.

14. The apparatus of claim 12, wherein:
the three-dimensional stair step structure of each respective group of memory cells comprises a plurality of stair steps; and
each respective one of the plurality of stair steps is coupled to a different one of the planar horizontal conductive lines.

15. The apparatus of claim 12, wherein:
the memory cells of each respective group comprise a plurality of vertical strings of memory cells; and
each respective string driver comprises a horizontal planar structure.

16. The apparatus of claim 12, wherein each of the groups of memory cells are tile groups of memory cells.

17. The apparatus of claim 12, wherein the plurality of groups of memory cells comprises four groups of memory cells.

* * * * *